(12) United States Patent
Huang et al.

(10) Patent No.: US 12,142,687 B2
(45) Date of Patent: Nov. 12, 2024

(54) ACTIVE DEVICE SUBSTRATE AND FABRICATION METHOD OF ACTIVE DEVICE SUBSTRATE

(71) Applicant: Au Optronics Corporation, Hsinchu (TW)

(72) Inventors: Chen-Shuo Huang, Hsinchu (TW); Kuo-Kuang Chen, Hsinchu (TW); Chih-Ling Hsueh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 444 days.

(21) Appl. No.: 17/572,662

(22) Filed: Jan. 11, 2022

(65) Prior Publication Data

US 2022/0254933 A1 Aug. 11, 2022

(30) Foreign Application Priority Data

Feb. 8, 2021 (TW) .................................. 110104720

(51) Int. Cl.
*H01L 29/786* (2006.01)
*H01L 21/02* (2006.01)
(Continued)

(52) U.S. Cl.
CPC .... *H01L 29/78606* (2013.01); *H01L 21/0217* (2013.01); *H01L 21/02274* (2013.01);
(Continued)

(58) Field of Classification Search
CPC ......... H01L 29/78606; H01L 29/66969; H01L 29/78633; H01L 29/78648; H01L 29/7869;
(Continued)

(56) References Cited

U.S. PATENT DOCUMENTS 7,800,178 B2 9/2010 Makita
8,866,136 B2* 10/2014 Jung ................. H01L 29/78606
438/38

(Continued)

OTHER PUBLICATIONS

Narihiro Morosawa et al., "Self-Aligned Top-Gate Oxide Thin-Film Transistor Formed by Aluminum Reaction Method", Japanese Journal of Applied Physics 50 (2011) 096502, Sep. 20, 2011, pp. 1-5.

*Primary Examiner* — Christine A Enad

(74) *Attorney, Agent, or Firm* — JCIPRNET

(57) ABSTRACT

An active device substrate includes a substrate, an active device and a barrier layer. The active device is located on the substrate. The barrier layer is located on the active device. The barrier layer includes a first hydrogen atom distribution region and a second hydrogen atom distribution region. The first hydrogen atom distribution region includes silicon nitride and hydrogen atom. The first hydrogen atom distribution region is located between the second hydrogen atom distribution region and the substrate. The second hydrogen atom distribution region includes silicon nitride and hydrogen atom. The concentration of nitrogen atom in the first hydrogen atom distribution region is less than the concentration of nitrogen atom in the second hydrogen atom distribution region. The highest concentration of hydrogen atom in the first hydrogen atom distribution region is greater than the highest concentration of hydrogen atom in the second hydrogen atom distribution region.

12 Claims, 9 Drawing Sheets

(51) Int. Cl.
*H01L 27/12* (2006.01)
*H01L 29/66* (2006.01)
*H10K 59/121* (2023.01)

(52) U.S. Cl.
CPC .... *H01L 21/02565* (2013.01); *H01L 27/1225* (2013.01); *H01L 27/127* (2013.01); *H01L 29/66969* (2013.01); *H01L 29/78633* (2013.01); *H01L 29/78648* (2013.01); *H01L 29/7869* (2013.01); *H10K 59/1213* (2023.02)

(58) Field of Classification Search
CPC ........... H01L 21/0217; H01L 21/02274; H01L 21/02565
See application file for complete search history.

(56) References Cited

U.S. PATENT DOCUMENTS

2017/0294543 A1\* 10/2017 Yamazaki ............. H01L 29/518
2020/0247715 A1\* 8/2020 Adib .................... C03C 17/225

\* cited by examiner

ACTIVE DEVICE SUBSTRATE AND FABRICATION METHOD OF ACTIVE DEVICE SUBSTRATE

CROSS-REFERENCE TO RELATED APPLICATION

This application claims the priority benefit of Taiwan application serial no. 110104720, filed on Feb. 8, 2021. The entirety of the above-mentioned patent application is hereby incorporated by reference herein and made a part of this specification.

BACKGROUND OF THE INVENTION

1. Field of the Invention

The present invention relates to an active device substrate, and particularly relates to an active device substrate with a barrier layer and a manufacturing method of the active device substrate.

2. Description of Related Art

In the existing manufacturing process of electronic devices, if the semiconductor material is exposed to moisture and/or hydrogen gas, the properties of the semiconductor material may change, which in turn affects the manufacturing yield of the electronic devices. For example, if a semiconductor layer of a thin film transistor is exposed to hydrogen gas, the conductivity of the semiconductor layer may be changed, causing the thin film transistor to fail. Therefore, there is an urgent need for a method that can prevent the semiconductor layer from contacting moisture and/or hydrogen gas.

SUMMARY OF THE INVENTION

The present invention provides an active device substrate that can prevent moisture and hydrogen from damaging the active device.

The present invention provides a manufacturing method of an active device substrate that can prevent moisture and hydrogen from damaging the semiconductor layer.

At least one embodiment of the present invention provides an active device substrate. The active device substrate includes a substrate, an active device and a barrier layer. The active device is located on the substrate. The barrier layer is located on the active device. The barrier layer includes the first hydrogen atom distribution region and the second hydrogen atom distribution region. The first hydrogen atom distribution region is located on the active device. The first hydrogen atom distribution region includes silicon nitride and hydrogen atoms. The first hydrogen atom distribution region is located between the second hydrogen atom distribution region and substrate. The second hydrogen atom distribution region includes silicon nitride and hydrogen atoms. The concentration of nitrogen atoms in the first hydrogen atom distribution region is smaller than the concentration of nitrogen atoms in the second hydrogen atom distribution region. The highest concentration of hydrogen atoms in the first hydrogen atom distribution region is greater than the highest concentration of hydrogen atoms in the second hydrogen atom distribution region. The thickness of the first hydrogen atom distribution region is less than or equal to the thickness of the second hydrogen atom distribution region.

At least one embodiment of the present invention provides an active device substrate. The active device substrate includes a substrate, an active device and a barrier layer. The active device is located on the substrate and includes a semiconductor layer, a first gate, a source and a drain. The semiconductor layer is located on the substrate. The first gate is overlapping with the semiconductor layer. A gate insulation layer is sandwiched between the first gate and the semiconductor layer. The first gate includes aluminum, aluminum alloy, or stacked layers comprising an aluminum layer. The source and the drain are electrically connected to the semiconductor layer. The barrier layer is located on the active device. The barrier layer includes silicon oxynitride and hydrogen atoms. The first gate is located between the barrier layer and the semiconductor layer.

At least one embodiment of the present invention provides a manufacturing method of an active device substrate. The manufacturing method of an active device substrate includes: providing a substrate; forming a semiconductor layer on the substrate; forming a barrier layer on the semiconductor layer using a thin film deposition process. The barrier layer includes a first hydrogen atom distribution region and a second hydrogen atom distribution region. The first hydrogen atom distribution region is located on the semiconductor layer. The first hydrogen atom distribution region includes silicon nitride and hydrogen atoms. The first hydrogen atom distribution region is located between the second hydrogen atom distribution region and the substrate. The second hydrogen atom distribution region includes silicon nitride and hydrogen atoms. The concentration of nitrogen atoms in the first hydrogen atom distribution region is smaller than the concentration of nitrogen atoms in the second hydrogen atom distribution region. The highest concentration of hydrogen atoms in the first hydrogen atom distribution region is greater than the highest concentration of hydrogen atoms in the second hydrogen atom distribution region. The thickness of the first hydrogen atom distribution region is less than or equal to the thickness of the second hydrogen atom distribution region.

DESCRIPTION OF THE EMBODIMENTS

FIGS. 1A to 1D are schematic cross-sectional views of a manufacturing method of an active device substrate according to an embodiment of the present invention.

Figure 1A:
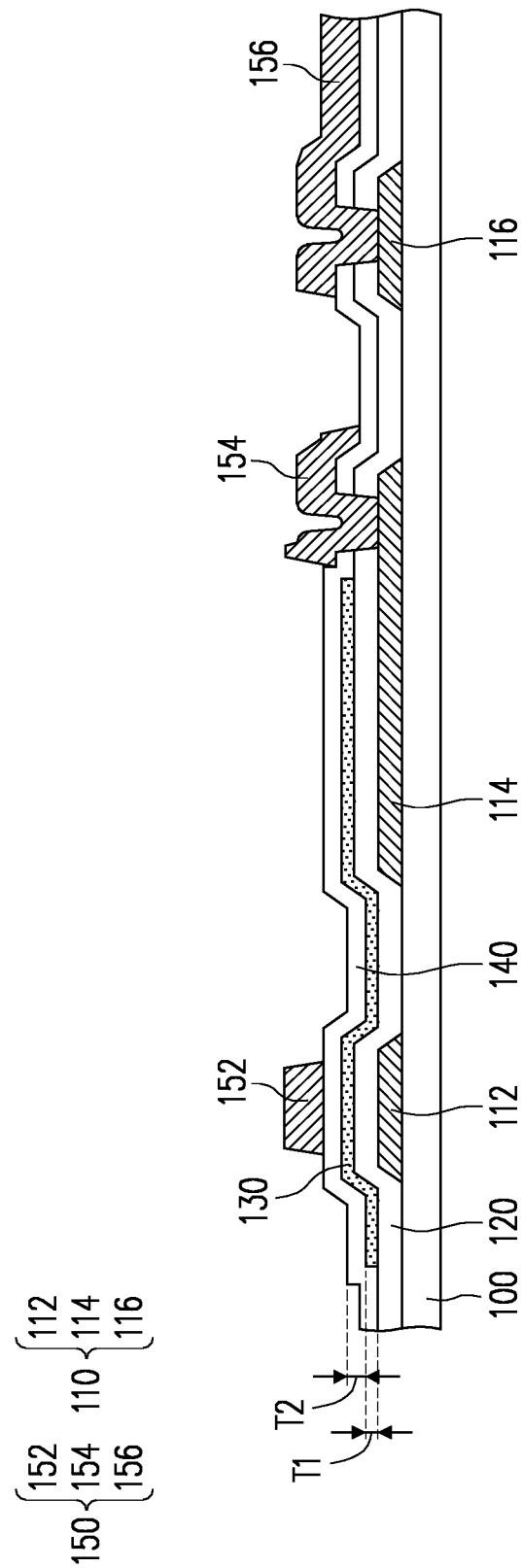
FIGS. 1A to 1D are schematic cross-sectional views of a manufacturing method of an active device substrate according to an embodiment of the present invention.

Referring to FIG. 1A, a substrate 100 is provided. The material of the substrate 100 may be glass, quartz, organic polymer, or opaque/reflective material (for example: conductive material, metal, wafer, ceramic or other suitable materials) or other suitable materials. If conductive materials or metals are used, an insulation layer (not shown) is covered on the substrate 100 to avoid short circuit problems.

A semiconductor layer 130 is formed on the substrate 100. In this embodiment, the material of the semiconductor layer 130 includes metal oxide. For example, the material of the semiconductor layer 130 includes indium-gallium-zinc oxide (IGZO), zinc oxide (ZnO), tin oxide (SnO), indium-zinc oxide (IZO), gallium-zinc oxide (GZO), zinc-tin oxide (ZTO) or indium-tin oxide (ITO) or other suitable materials. In this embodiment, the material of the semiconductor layer 130 includes indium-gallium-zinc oxide, and the thickness T1 is 5 nanometers to 100 nanometers.

In this embodiment, before forming the semiconductor layer 130, a first conductive layer 110 and a first insulation layer 120 are formed on the substrate 100. The first conductive layer 110 has a single-layer or multi-layer structure.

The first conductive layer 110 includes a light shielding structure 112, a capacitance electrode 114 and a signal line 116. The semiconductor layer 130 is overlapping with the light shielding structure 112. The first insulation layer 120 covers the first conductive layer 110. The semiconductor layer 130 is formed on the first insulation layer 120.

A gate insulation layer 140 is formed on the semiconductor layer 130. In some embodiments, the gate insulation layer 140 includes silicon nitride, silicon oxide, silicon oxynitride ($SiON_x$), silicon nitride oxide ($SiNO_x$), aluminum nitride, aluminum oxide, hafnium oxide, metal oxide, metal nitride, photoresist or other suitable material, wherein the concentration of oxygen is greater than the concentration of nitrogen in the silicon oxynitride, and the concentration of nitrogen is greater than the concentration of oxygen in the silicon nitride oxide. In this embodiment, the gate insulation layer 140 is silicon oxynitride, and the thickness thereof is 10 nanometers to 500 nanometers.

A second conductive layer 150 is formed on the gate insulation layer 140. The second conductive layer 150 includes a first gate 152, a signal line 154 and a signal line 156. The first gate 152 is overlapping with the semiconductor layer 130. The gate insulation layer 140 is sandwiched between the first gate 152 and the semiconductor layer 130. The signal line 154 is electrically connected to the capacitance electrode 114 through a through hole passing through the first insulation layer 120 and the gate insulation layer 140. The signal line 156 is electrically connected to the signal line 116 through a through hole passing through the first insulation layer 120 and the gate insulation layer 140. The second conductive layer 150 has a single-layer or multi-layer structure. The material of the second conductive layer 150 includes aluminum, aluminum alloy, molybdenum aluminum alloy, titanium aluminum alloy, molybdenum titanium aluminum alloy, or stacked layers including an aluminum layer.

Figure 1B:
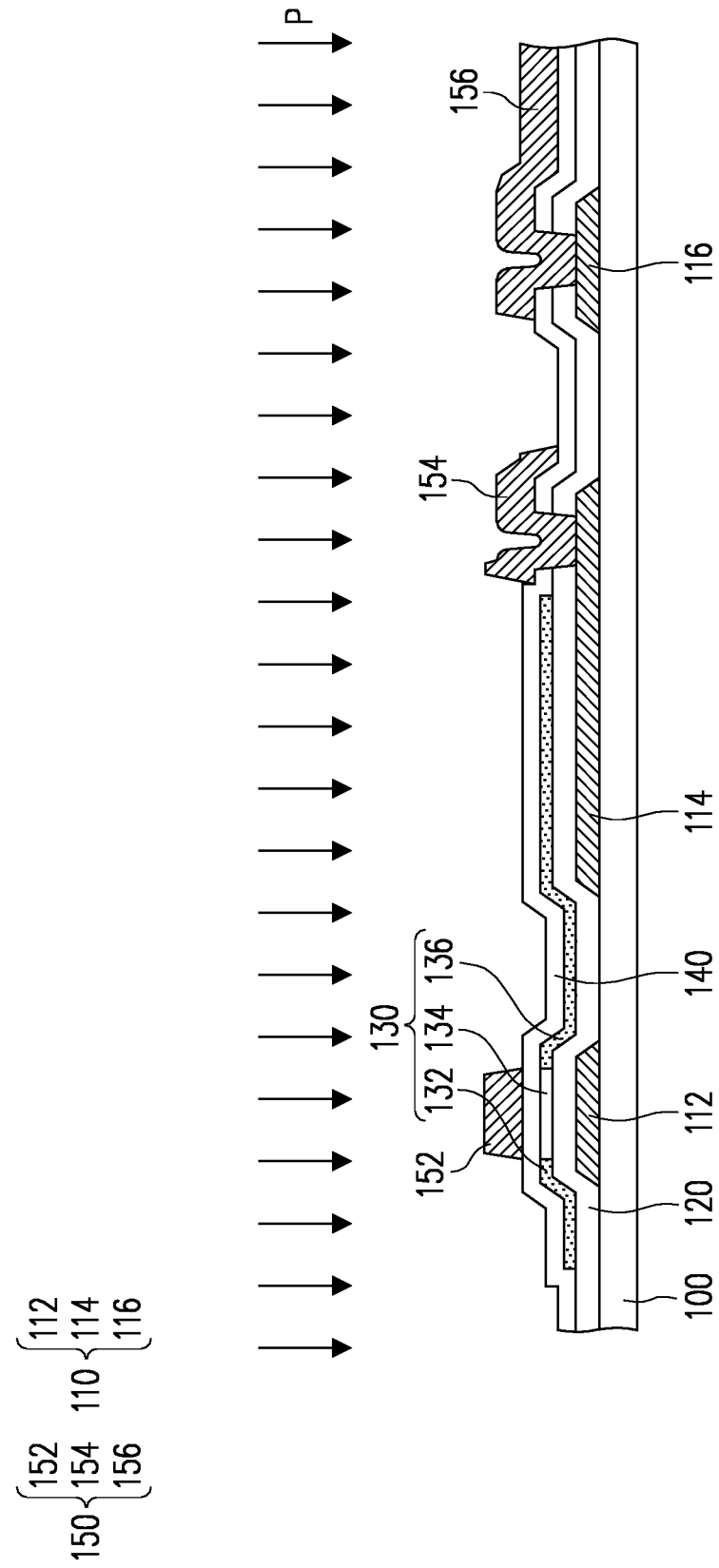

Referring to FIG. 1B, a doping process P is performed on the semiconductor layer 130 to form a doping region 132, a doping region 136 and a channel region 134 in the semiconductor layer 130. The channel region 134 is located between the doping region 132 and the doping region 136. In this embodiment, the doping process P is a hydrogen plasma treatment process, but the invention is not limited thereto. In other embodiments, the doping process P is an ion implantation process or other suitable doping process. In some embodiments, the doping process P is performed on the semiconductor layer 130 with using the second conductive layer 150 as a mask, but the invention is not limited thereto. In other embodiments, another mask (such as a photoresist) is formed, and the doping process P is performed on the semiconductor layer 130 with using the other mask as the mask.

Figure 1C:
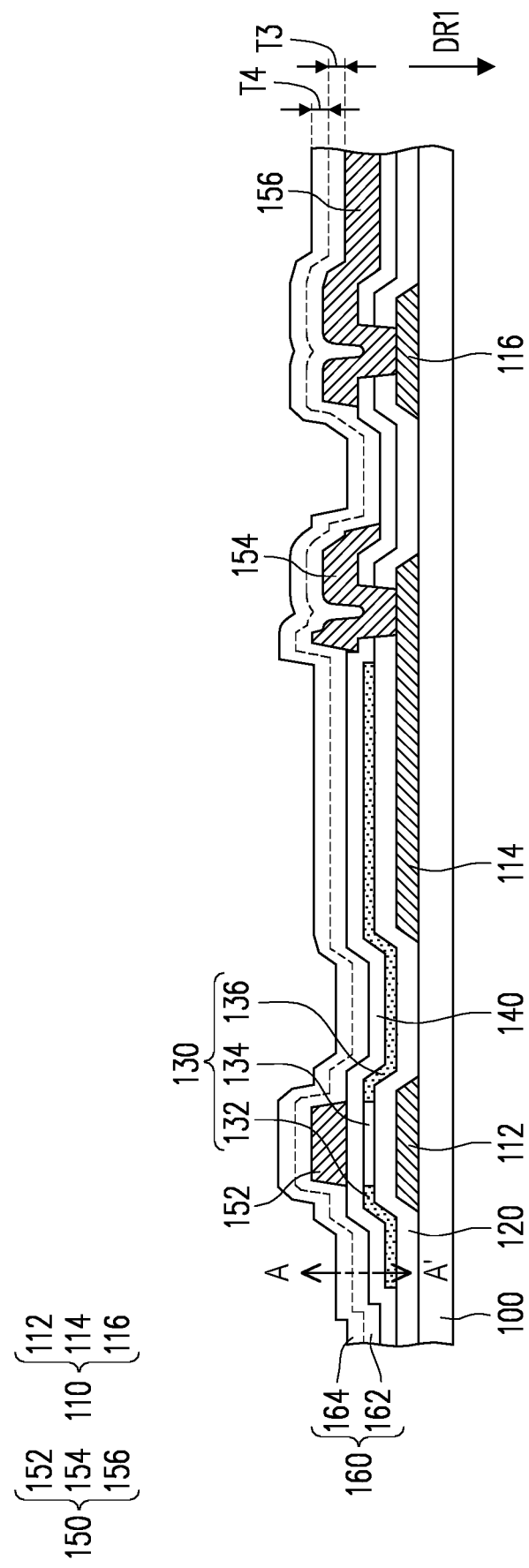

Referring to FIG. 1C, a barrier layer 160 is formed on the semiconductor layer 130 by a thin film deposition process. In this embodiment, a barrier layer 160 is formed on the first gate 152, the signal line 154, the signal line 156 and the gate insulation layer 140 by the thin film deposition process. The thin film deposition process includes a plasma enhanced chemical vapor deposition (PECVD).

The material of the barrier layer 160 includes hydrogen atoms and silicon nitride ($SiN_x$) or silicon nitride oxide ($SiNO_x$). In this embodiment, the thickness of the barrier layer 160 (thickness T3 plus thickness T4) is 50 nanometers to 600 nanometers. In this embodiment, the hydrogen atom concentration in the barrier layer 160 is $1E21$ atoms/cm$^3$ to $5E22$ atoms/cm$^3$ (for example, $1E22$ atoms/cm$^3$ to $5E22$ atoms/cm$^3$). In this embodiment, the nitrogen atom concentration in the barrier layer 160 is $1E21$ atoms/cm$^3$ to $5E23$ atoms/cm$^3$, for example, $1E21$ atoms/cm$^3$ to $1E22$ atoms/cm$^3$.

In some embodiments, the gate insulation layer 140 includes oxygen atoms. Therefore, some of the oxygen atoms may diffuse into the barrier layer 160. In this embodiment, the oxygen atom concentration in the barrier layer 160 is $2E18$ atoms/cm$^3$ to $5E20$ atoms/cm$^3$ (for example, $2E18$ atoms/cm$^3$ to $5E19$ atoms/cm$^3$).

Figure 2A:
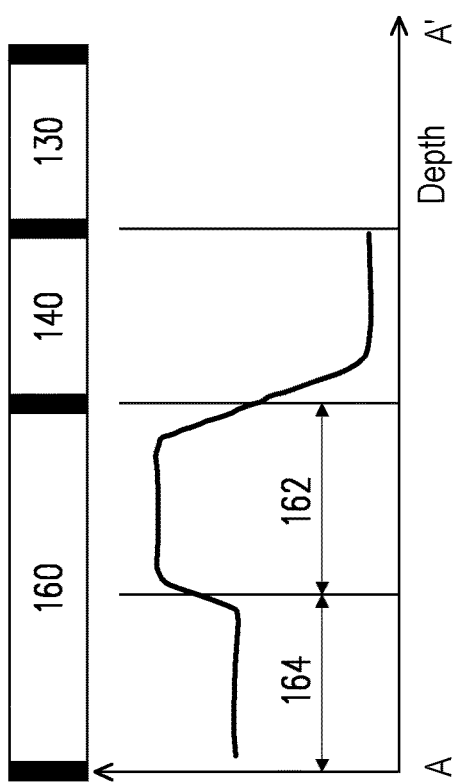
FIG. 2A is a schematic diagram of the nitrogen atom concentration distribution of an active device substrate according to an embodiment of the present invention.
Figure 2B:
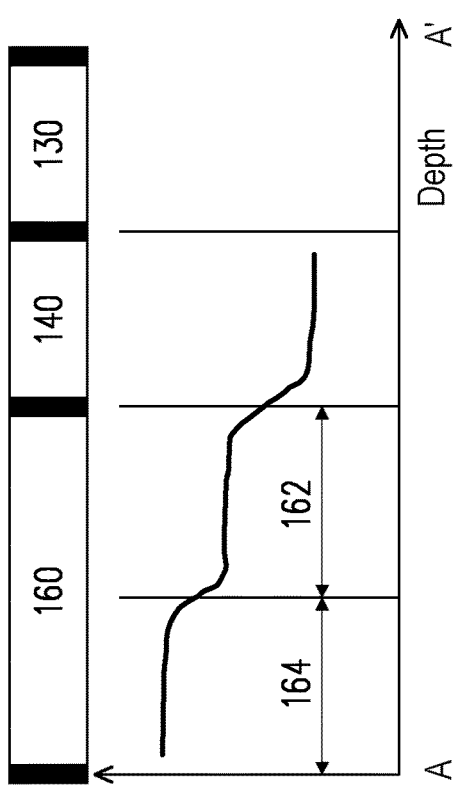
FIG. 2B is a schematic diagram of the hydrogen atom concentration distribution of an active device substrate according to an embodiment of the present invention.
Figure 2C:
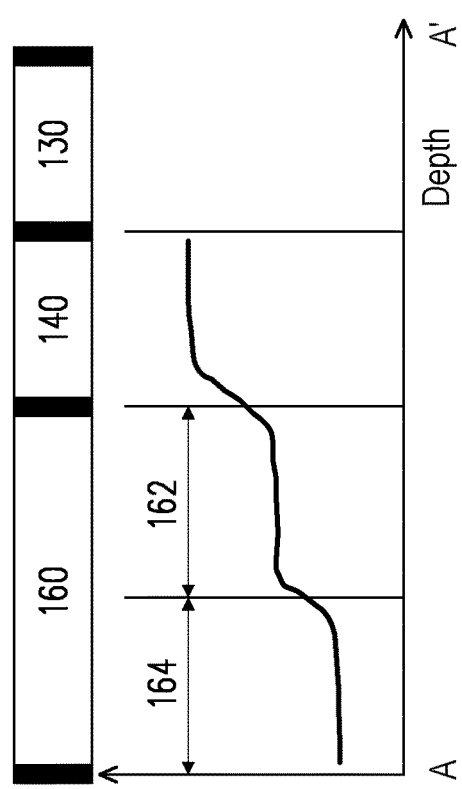
FIG. 2C is a schematic diagram of the oxygen atom concentration distribution of an active device substrate according to an embodiment of the present invention.

FIG. 2A is a schematic diagram of the nitrogen atom concentration distribution of an active device substrate according to an embodiment of the present invention. FIG. 2B is a schematic diagram of the hydrogen atom concentration distribution of an active device substrate according to an embodiment of the present invention. FIG. 2C is a schematic diagram of the oxygen atom concentration distribution of an active device substrate according to an embodiment of the present invention. It should be noted that FIGS. 2A to 2C are used to show the relative concentration changes of different elements at different depths on the line A-A' of FIG. 1C, and are not used to show the specific concentration values of different elements. The unit of the vertical axis in FIGS. 2A to 2C is, for example, at % or atom/cm$^3$.

Referring to FIG. 1C and FIGS. 2A to 2C, the barrier layer 160 includes a first hydrogen atom distribution region 162 and a second hydrogen atom distribution region 164. The first hydrogen atom distribution region 162 is located on the semiconductor layer 130. In this embodiment, the first hydrogen atom distribution region 162 contacts and covers the first gate 152, the signal line 154, the signal line 156 and the gate insulation layer 140. The first gate 152 is located between the first hydrogen atom distribution region 162 and the semiconductor layer 130.

The second hydrogen atom distribution region 164 is located on the first hydrogen atom distribution region 162, and the first hydrogen atom distribution region 162 is located between the second hydrogen atom distribution region 164 and the substrate 100. The second hydrogen atom distribution region 164 is directly connected to the first hydrogen atom distribution region 162. The first hydrogen atom distribution region 162 includes silicon nitride and hydrogen atoms. The second hydrogen atom distribution region 164 includes silicon nitride and hydrogen atoms.

In this embodiment, the method of forming the first hydrogen atom distribution region 162 and the second hydrogen atom distribution region 164 includes plasma enhanced chemical vapor deposition. for example, using silane (SiH$_4$), ammonia gas (NH$_3$) and nitrogen gas (N$_2$) as raw materials to form silicon nitride (SiN$_x$), H$_x$ radical and NH$_x$ radical and nitrogen gas.

In this embodiment, the second hydrogen atom distribution region 164 is denser than the first hydrogen atom distribution region 162, and the rate of the dissociation of H$_x$ radical generated during the deposition of the first hydrogen atom distribution region 162 is smaller than the rate of the dissociation of H$_X$ radical generated during the deposition of the second hydrogen atom distribution region 164. In this embodiment, the concentration of the nitrogen atoms in the first hydrogen atom distribution region 162 is smaller than the concentration of the nitrogen atoms in the second hydrogen atom distribution region 164. The highest concentration of the hydrogen atom in the first hydrogen atom distribution region 162 is greater than the highest concentration of the hydrogen atoms in the second hydrogen atom distribution region 164.

In this embodiment, the rate of generation of H$_x$ radical during the deposition of the first hydrogen atom distribution region 162 is slower, so the problem that hydrogen diffuses into the semiconductor layer 130 during the deposition of the first hydrogen atom distribution region 162 can be alleviated, and the electrical conductivity of the semiconductor layer 130 can be prevented from being affected. In this embodiment, although the highest concentration of the hydrogen atoms in the first hydrogen atom distribution region 162 is greater than the highest concentration of the hydrogen atoms in the second hydrogen atom distribution region 164, the hydrogen atoms generated during the deposition of the first hydrogen atom distribution region 162 is not easier to move than the hydrogen atoms generated during the deposition of the second hydrogen atom distribution region 164. Therefore, the hydrogen ions diffusing into the semiconductor layer 130 during the process of the deposition of the barrier layer 160 may be reduced.

In some embodiments, the boundary between the first hydrogen atom distribution region 162 and the second hydrogen atom distribution region 164 is defined by the average value of the nitrogen concentration of the barrier layer 160. In other words, the nitrogen concentration on the boundary between the first hydrogen atom distribution region 162 and the second hydrogen atom distribution region 164 is equal to the average value of the nitrogen concentration of the barrier layer 160.

In some embodiments, the distribution of concentration of the hydrogen atoms in the first hydrogen atom distribution region 162 increases first and then decreases in the direction DR1 toward the substrate 100. In some embodiments, the concentration of the nitrogen atoms in the first hydrogen atom distribution region 162 is gradually decreasing in the direction DR1 toward the substrate 100.

In some embodiments, the concentration of the hydrogen atoms in the first hydrogen atom distribution region 162 is 1E22 atoms/cm$^3$ to 5E22 atoms/cm$^3$, and the concentration of the hydrogen atoms in the second hydrogen atom distribution region 164 is 1E21 atoms/cm$^3$ to 5E22 atoms/cm$^3$. In some embodiments, the concentration of the hydrogen atoms in the gate insulation layer 140 is 5E20 atoms/cm$^3$ to 5E21 atoms/cm$^3$.

In some embodiments, the concentration of the nitrogen atoms in the first hydrogen atom distribution region 162 is 1E21 atoms/cm$^3$ to 1E22 atoms/cm$^3$, and the concentration of the nitrogen atoms in the second hydrogen atom distribution region 164 is 1E21 atoms/cm$^3$ to 5E23 atoms/cm$^3$. In some embodiments, the concentration of the nitrogen atoms in the gate insulation layer 140 is 2E18 atoms/cm$^3$ to 5E20 atoms/cm$^3$.

In this embodiment, the thickness T3 of the first hydrogen atom distribution region 162 is less than or equal to the thickness T4 of the second hydrogen atom distribution region 164. In some embodiments, the thickness T3 is 10 nanometers to 600 nanometers, and the thickness T4 is 10 nanometers to 600 nanometers.

In some embodiments, the first hydrogen atom distribution region 162 and the second hydrogen atom distribution region 164 are formed in the same deposition process, but the process parameters of the deposition of the first hydrogen atom distribution region 162 are different from the process parameters of the deposition of the second hydrogen atom distribution region 164. For example, the power used for depositing the second hydrogen atom distribution region 164 is greater than the power used for depositing the first hydrogen atom distribution region 162. In other embodiments, the flow rate of the raw materials used in the deposition of the first hydrogen atom distribution region 162 is different from the flow rate of the raw materials used in the deposition of the second hydrogen atom distribution region 164.

In some embodiments, the concentration of the oxygen atoms in the first hydrogen atom distribution region 162 is higher than the concentration of the oxygen atoms in the second hydrogen atom distribution region 164.

In some embodiments, the concentration of the oxygen atoms in the first hydrogen atom distribution region 162 is 2E18 atoms/cm$^3$ to 5E19 atoms/cm$^3$, and the concentration of the oxygen atoms in the second hydrogen atom distribution region 164 is 2E18 atoms/cm$^3$ to 5E20 atoms/cm$^3$. In some embodiments, the concentration of the oxygen atoms in the gate insulation layer 140 is 1E21 atoms/cm$^3$ to 5E22 atoms/cm$^3$.

Figure 1D:
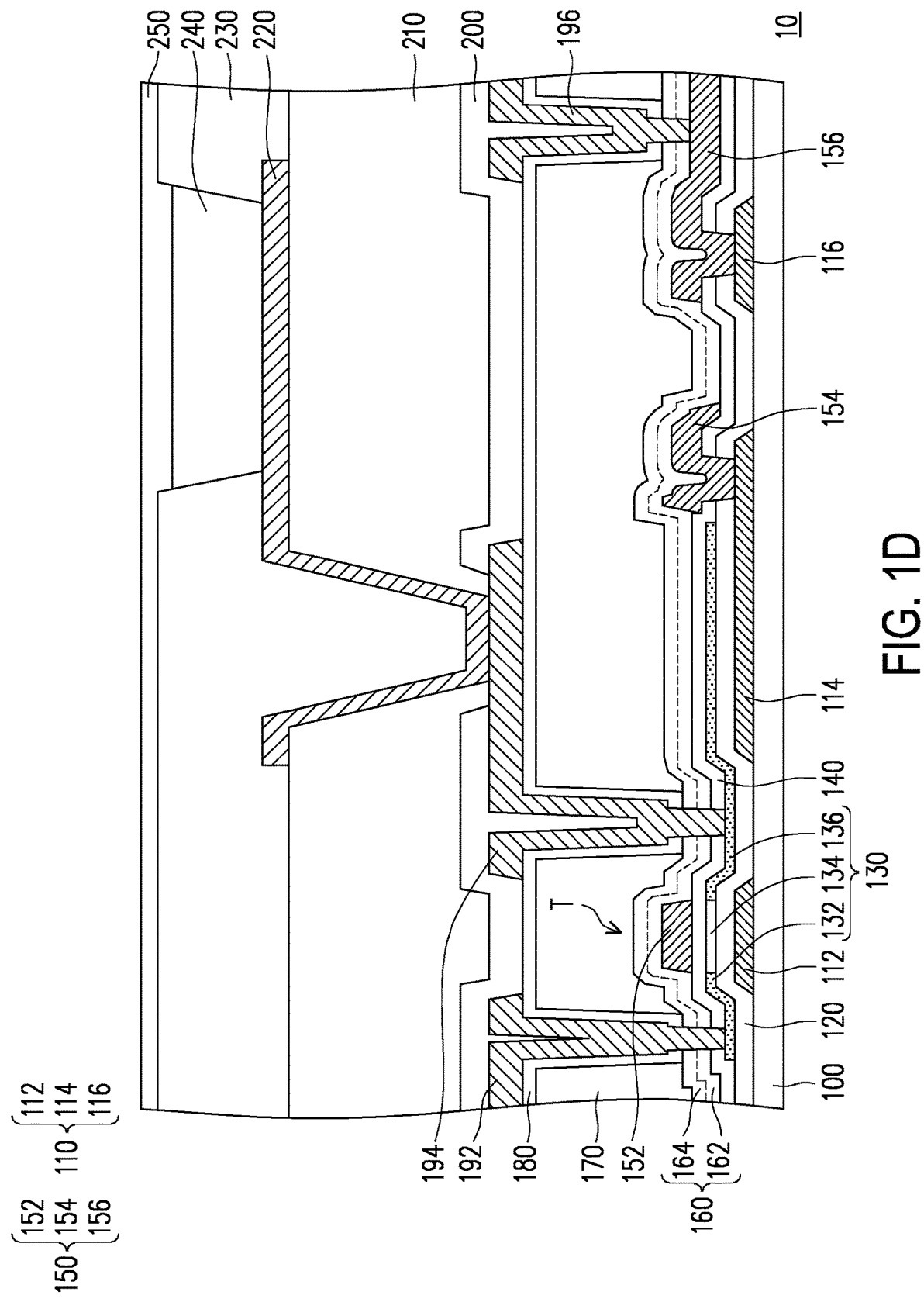

Referring to FIG. 1D, a planarization layer 170 is formed on the barrier layer 160. The planarization layer 170 contacts and covers the second hydrogen atom distribution region 164. A second insulation layer 180 is formed on the planarization layer 170.

A source 192, a drain 194 and a signal line 196 are formed on the second insulation layer 180. The source 192 and the drain 194 are electrically connected to the doping regions 132 and 136 of the semiconductor layer 130. The signal line 196 is electrically connected to the signal line 156.

An overcoat 200 is formed on the source 192, the drain 194 and the signal line 196. An insulation layer 210 is formed on the overcoat 200. A first electrode 220 is formed on the insulation layer 210, and the first electrode 220 is electrically connected to the drain 194. A pixel definition layer 230 is formed on the first electrode 220. An organic light emitting semiconductor layer 240 is formed in an opening of the pixel definition layer 230, and the organic light emitting semiconductor layer 240 contacts the first electrode 220. A second electrode 250 is formed on the organic light emitting semiconductor layer 240.

In this embodiment, the active device substrate 10 includes the substrate 100, the active device T and the barrier layer 160. In this embodiment, the active device T is a top gate type thin film transistor, but the invention is not limited thereto. In other embodiments, the active device T is a bottom gate type thin film transistor. For example, the light-shielding structure 112 of the first conductive layer 110 can be used as the first gate. In other embodiments, the active device T is a duel gate type thin film transistor. For example, the second conductive layer 150 includes the first gate 152, and the light-shielding structure 112 of the first conductive layer 110 can be used as a second gate, wherein the second gate overlaps the semiconductor layer 130, and the second gate is located between the substrate 100 and the semiconductor layer 130.

In this embodiment, the active device substrate 10 is suitable for an organic light emitting diode display (OLED display), but the invention is not limited thereto. In other embodiments, the active device substrate 10 is suitable for micro-LED displays, liquid crystal display devices or other electronic devices.

Figure 3A:
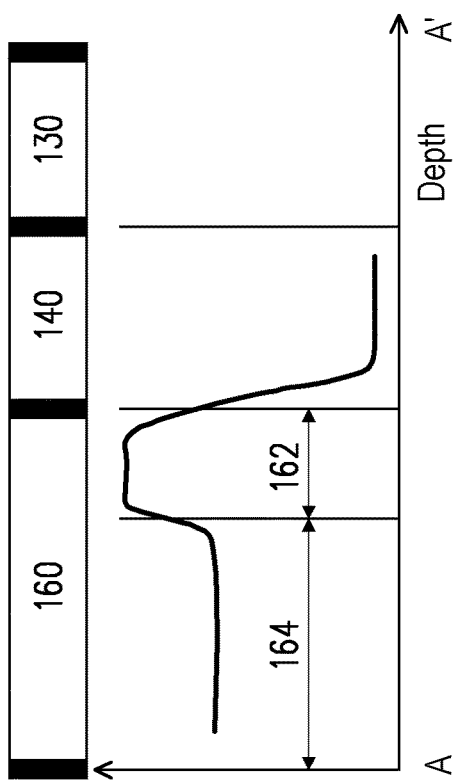
FIG. 3A is a schematic diagram of the nitrogen atom concentration distribution of an active device substrate according to an embodiment of the present invention.
Figure 3B:
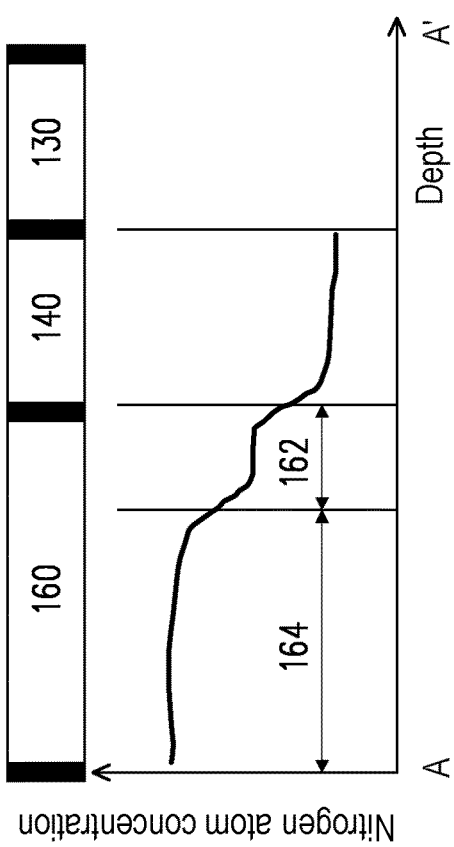
FIG. 3B is a schematic diagram of the hydrogen atom concentration distribution of an active device substrate according to an embodiment of the present invention.
Figure 3C:
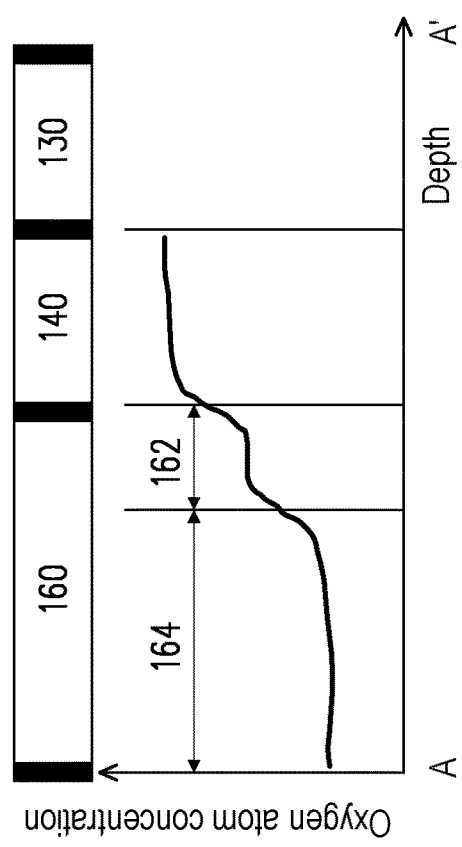
FIG. 3C is a schematic diagram of the oxygen atom concentration distribution of an active device substrate according to an embodiment of the present invention.

FIG. 3A is a schematic diagram of the nitrogen atom concentration distribution of an active device substrate according to an embodiment of the present invention. FIG. 3B is a schematic diagram of the hydrogen atom concentration distribution of an active device substrate according to an embodiment of the present invention. FIG. 3C is a schematic diagram of the oxygen atom concentration distribution of an active device substrate according to an embodiment of the present invention. It should be noted that FIGS. 3A to 3C are used to show the relative concentration changes of different elements at different depths of the active device substrate, and are not used to show the specific concentration values of different elements. The unit of the vertical axis in FIGS. 3A to 3C is, for example, at % or atom/cm$^3$.

The embodiment of FIGS. 3A to 3C is similar to the embodiment of FIGS. 2A to 2C. The difference is that the thickness of the first hydrogen atom distribution region 162 is smaller than the thickness of the second hydrogen atom distribution region 164 in the embodiment of FIGS. 3A to 3C.

Figure 4:
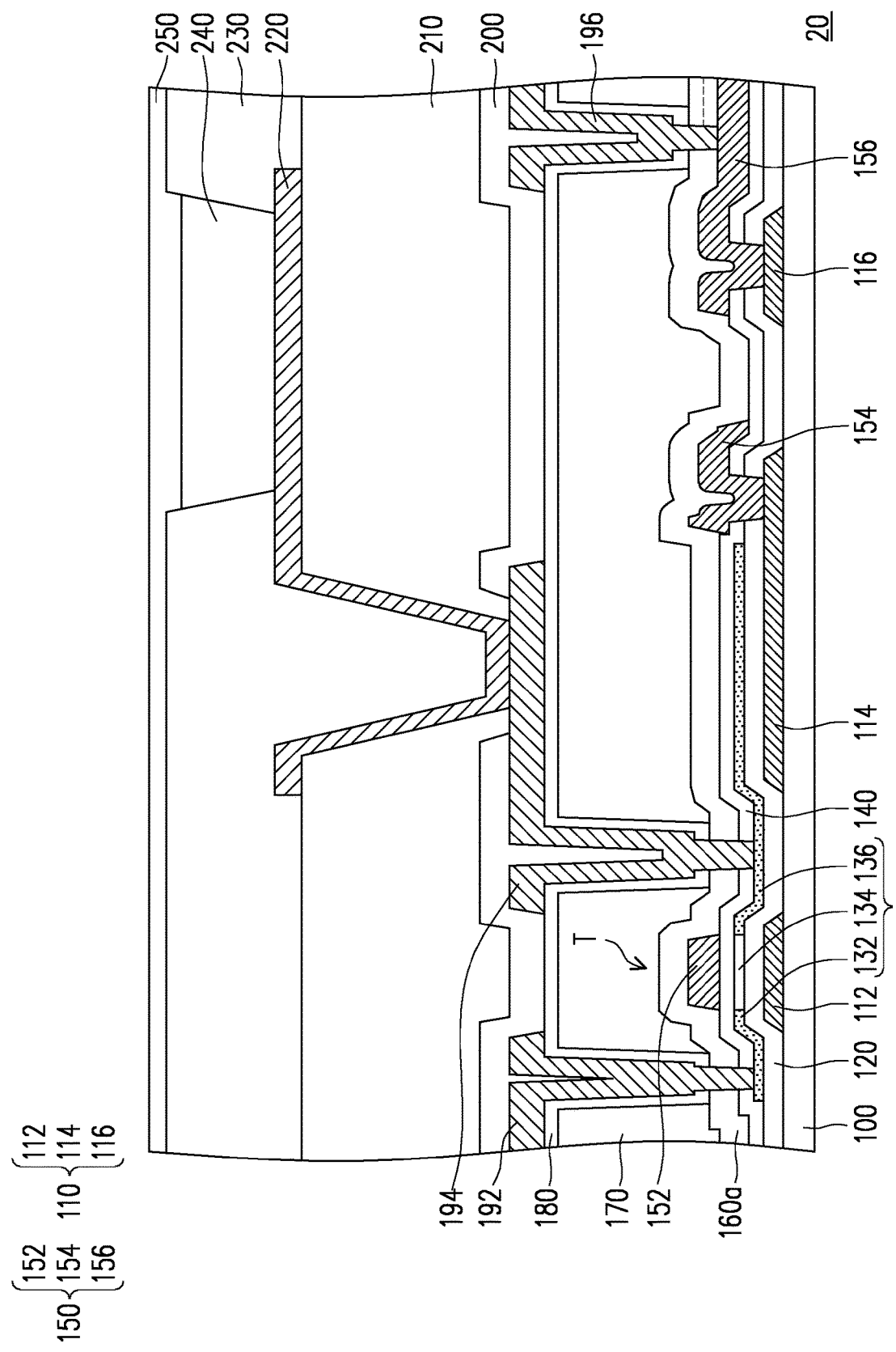
FIG. 4 is a schematic cross-sectional view of an active device substrate according to an embodiment of the present invention.

FIG. 4 is a schematic cross-sectional view of an active device substrate according to an embodiment of the present invention. It should be noted herein that, in embodiments provided in FIG. 4, element numerals and partial content of the embodiments provided in FIGS. 1A to 1D are followed, the same or similar reference numerals being used to represent the same or similar elements, and description of the same technical content being omitted. For a description of an omitted part, reference may be made to the foregoing embodiment, and the descriptions thereof are omitted herein.

The difference between the active device substrate 20 of FIG. 4 and the active device substrate 10 of FIG. 1D is that the barrier layer 160a of the active device substrate 20 of FIG. 4 includes silicon nitride oxide (SiNO$_x$) and hydrogen atoms.

Referring to FIG. 4, in this embodiment, the method of forming the barrier layer 160a includes plasma enhanced chemical vapor deposition. For example, using silane (SiH$_4$), ammonia (NH$_3$), nitrous oxide (N$_2$O) and nitrogen gas (N$_2$) as raw materials to form silicon nitride oxide, H$_x$ radical and NH$_x$ radical and nitrogen gas. In this embodiment, the gate insulation layer 140 includes silicon oxynitride (SiON$_x$).

In this embodiment, the concentration of the hydrogen atoms in the barrier layer 160s is 5E20 atoms/cm$^3$ to 5E21 atoms/cm$^3$. In this embodiment, the concentration of the nitrogen atoms in the barrier layer 160a is 1E21 atoms/cm$^3$ to 5E22 atoms/cm$^3$. In this embodiment, the concentration of the oxygen atoms in the barrier layer 160a is 1E21 atoms/cm$^3$ to 5E22 atoms/cm$^3$.

In this embodiment, the first gate 152 is overlapping with the semiconductor layer 130, and a gate insulation layer 140 is sandwiched between the first gate 152 and the semiconductor layer 130. The first gate 152 is located between the barrier layer 160a and the semiconductor layer 130. The first gate 152 includes aluminum, aluminum alloy, or stacked layers comprising an aluminum layer. Aluminum metal has the function of blocking hydrogen. Therefore, the first gate 152 can protect the channel region 134 of the semiconductor layer 130 during the deposition process of the barrier layer 160a, and reduce the diffusion of H$_x$ radical to the channel region 134 of the semiconductor layer 130. In this embodiment, the silicon nitride oxide in the barrier layer 160a is used to block moisture.

Figure 5A:
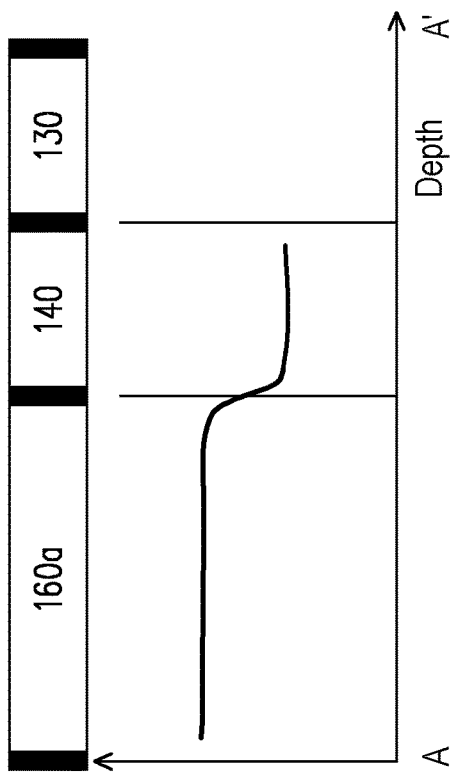
FIG. 5A is a schematic diagram of the nitrogen atom concentration distribution of an active device substrate according to an embodiment of the present invention.
Figure 5B:
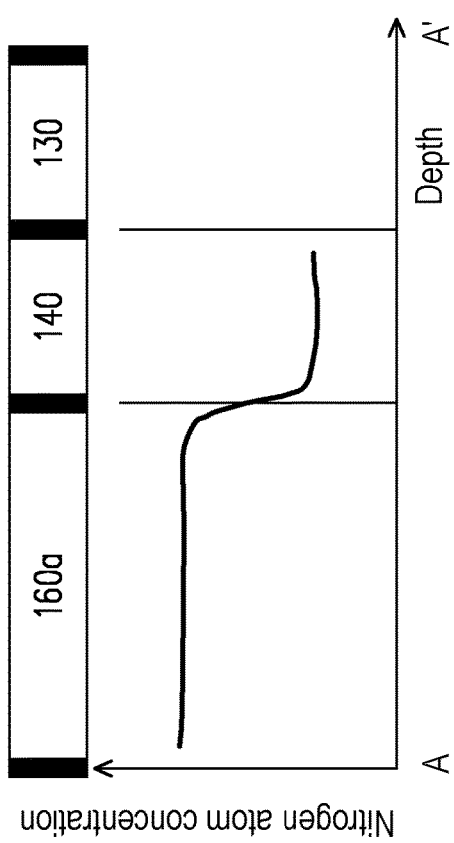
FIG. 5B is a schematic diagram of the hydrogen atom concentration distribution of an active device substrate according to an embodiment of the present invention.
Figure 5C:
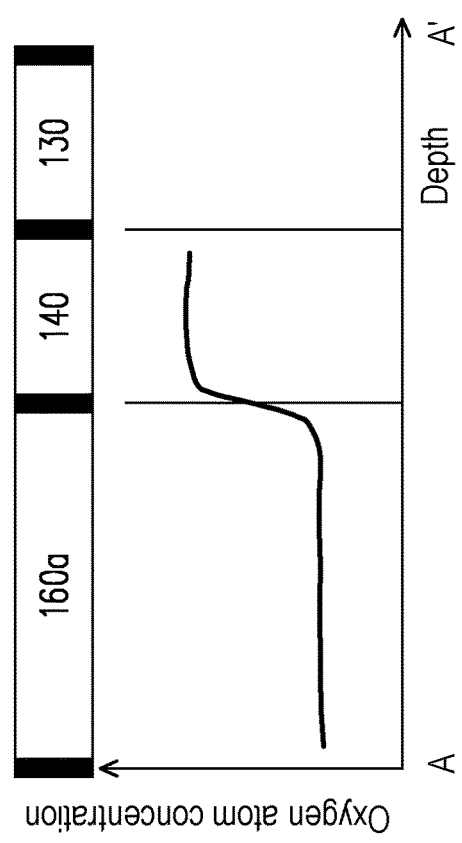
FIG. 5C is a schematic diagram of the oxygen atom concentration distribution of an active device substrate according to an embodiment of the present invention.

FIG. 5A is a schematic diagram of the nitrogen atom concentration distribution of an active device substrate according to an embodiment of the present invention. FIG. 5B is a schematic diagram of the hydrogen atom concentration distribution of an active device substrate according to an embodiment of the present invention. FIG. 5C is a schematic diagram of the oxygen atom concentration distribution of an active device substrate according to an embodiment of the present invention. It should be noted that FIGS. 5A to 5C are used to show the relative concentration changes of different elements at different depths on the line A-A' in FIG. 4, and are not used to show the specific concentration values of different elements. The unit of the vertical axis in FIGS. 5A to 5C is, for example, at % or atom/cm$^3$.

In this embodiment, the concentration of the nitrogen atoms in the barrier layer 160a is greater than the concentration of the nitrogen atoms in the gate insulation layer 140. In this embodiment, the concentration of the hydrogen atoms in the barrier layer 160a is greater than the concentration of the hydrogen atoms in the gate insulation layer 140. In this embodiment, the concentration of the oxygen atoms in the barrier layer 160a is smaller than the concentration of the oxygen atoms in the gate insulation layer 140.

In this embodiment, the barrier layer 160a includes silicon nitride oxide and can be used as a water blocking layer. The first gate 152 includes aluminum and can be used as a hydrogen blocking layer. Based on the above, the damage caused by moisture and hydrogen to the active device T can be avoided.

Figure 6A:
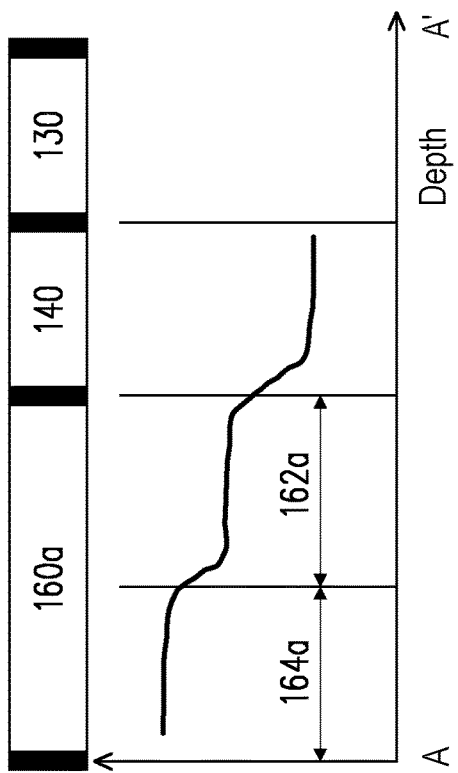
FIG. 6A is a schematic diagram of the nitrogen atom concentration distribution of an active device substrate according to an embodiment of the present invention.
Figure 6B:
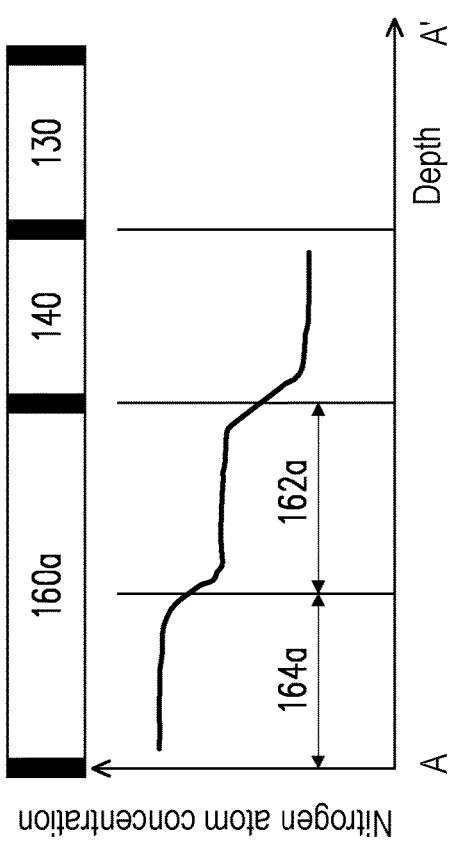
FIG. 6B is a schematic diagram of the hydrogen atom concentration distribution of an active device substrate according to an embodiment of the present invention.
Figure 6C:
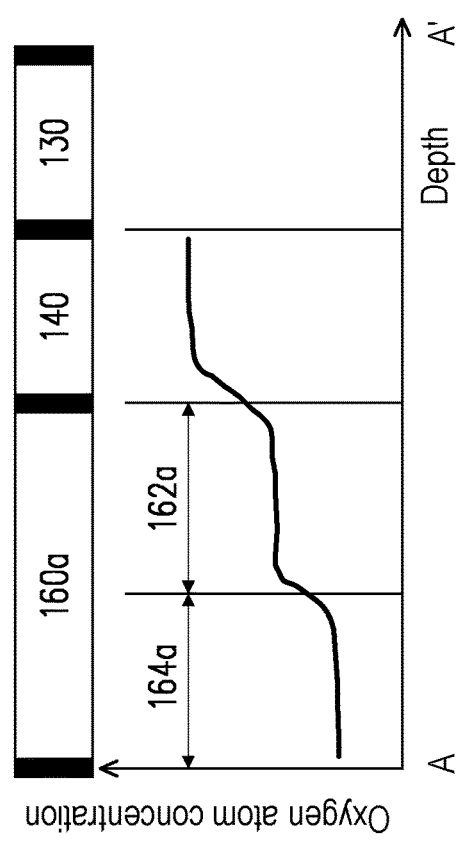
FIG. 6C is a schematic diagram of the oxygen atom concentration distribution of an active device substrate according to an embodiment of the present invention.

FIG. 6A is a schematic diagram of the nitrogen atom concentration distribution of an active device substrate according to an embodiment of the present invention. FIG. 6B is a schematic diagram of the hydrogen atom concentration distribution of an active device substrate according to an embodiment of the present invention. FIG. 6C is a schematic diagram of the oxygen atom concentration distribution of an active device substrate according to an embodiment of the present invention. It should be noted that FIGS. 6A to 6C are used to show the relative concentration changes of different elements at different depths of the active device substrate, and are not used to show the specific concentration values of different elements. The unit of the vertical axis in FIGS. 6A to 6C is, for example, at % or atom/cm$^3$.

The embodiment of FIGS. 6A to 6C is similar to the embodiment of FIGS. 5A to 5C. The difference is that: the barrier layer 160a of the embodiment of FIGS. 6A to 6C includes a first hydrogen atom distribution region 162a and a second hydrogen atom distribution region 164a.

Referring to FIGS. 6A to 6C, In this embodiment, the method of forming the barrier layer 160a includes a plasma enhanced chemical vapor deposition. For example, using silane, ammonia, nitrous oxide and nitrogen gas as raw materials to form silicon nitride oxide (SiNO$_x$), H$_x$ radical and NH$_x$ radical and nitrogen gas. In this embodiment, the gate insulation layer 140 includes silicon oxynitride (SiON$_x$).

The concentration of nitrogen atoms in the barrier layer 160a is greater than the concentration of nitrogen atoms in the gate insulation layer 140. In the embodiment, the concentration of the hydrogen atoms in the barrier layer 160a is greater than the concentration of the hydrogen atoms in the gate insulation layer 140. In the embodiment, the concentration of the oxygen atoms in the barrier layer 160a is smaller than the concentration of the oxygen atoms in the gate insulation layer 140.

The barrier layer 160a includes a first hydrogen atom distribution region 162a and a second hydrogen atom distribution region 164a. The first hydrogen atom distribution region 162a is located on the semiconductor layer 130. The first hydrogen atom distribution region 162a is located between the second hydrogen atom distribution region 164a and the substrate 100 (shown in FIG. 4). The concentration of the nitrogen atoms in the first hydrogen atom distribution region 162a is smaller than the concentration of the nitrogen atoms in the second hydrogen atom distribution region 164a. The concentration of the hydrogen atoms in the first hydrogen atom distribution region 162a is smaller than the concentration of the hydrogen atoms in the second hydrogen atom distribution region 164a.

In some embodiments, the boundary between the first hydrogen atom distribution region 162a and the second hydrogen atom distribution region 164a is defined by the average value of the nitrogen concentration of the barrier layer 160a. In other words, the nitrogen concentration on the boundary between the first hydrogen atom distribution region 162a and the second hydrogen atom distribution region 164a is equal to the average value of the nitrogen concentration of the barrier layer 160a.

In some embodiments, the first hydrogen atom distribution region 162a and the second hydrogen atom distribution region 164a are formed in the same deposition process, but the process parameters of the deposition of the first hydrogen atom distribution region 162a are different from the process parameters of the deposition of the second hydrogen atom distribution region 164a. For example, the power used for the deposition of the second hydrogen atom distribution region 164a is greater than the power used for the deposition of the first hydrogen atom distribution region 162a. In other embodiments, the ratio of the ammonia flow rate to the nitrous oxide flow rate in the raw materials used for the deposition of the first hydrogen atom distribution region 162a is lower than the ratio of the ammonia flow rate to the nitrous oxide flow rate in the raw materials used for the deposition of the second hydrogen atom distribution region 164a.

In this embodiment, the barrier layer 160a includes silicon nitride oxide and can be used as a water blocking layer. The first gate 152 includes aluminum and can be used as a hydrogen blocking layer. Based on the above, the damage caused by moisture and hydrogen to the active device T can be avoided.

What is claimed is:

1. An active device substrate, comprising:
a substrate;
an active device, located on the substrate, wherein the active device comprises:
a semiconductor layer, located on the substrate;
a first gate overlapping with and located on the semiconductor layer;
a gate insulation layer sandwiched between the first gate and the semiconductor layer; and
a source and a drain, electrically connected to the semiconductor layer; and
a barrier layer comprising:
a first hydrogen atom distribution region, located on the active device, wherein the first hydrogen atom distribution region comprises silicon nitride and hydrogen atoms, wherein the first hydrogen atom distribution region contacts and covers a portion of a top surface of the gate insulation layer, wherein the first hydrogen atom distribution region contacts and covers a top surface and a side surface of the first gate; and
a second hydrogen atom distribution region, wherein the first hydrogen atom distribution region is located between the second hydrogen atom distribution region and the semiconductor layer, wherein the second hydrogen atom distribution region includes silicon nitride and hydrogen atoms, wherein the concentration of nitrogen atoms in the first hydrogen atom distribution region is smaller than the concentration of nitrogen atoms in the second hydrogen atom distribution region, and the highest concentration of the hydrogen atoms in the first hydrogen atom distribution region is greater than the highest concentration of the hydrogen atoms in the second hydrogen atom distribution region, wherein the thickness of the first hydrogen atom distribution region is less than or equal to the thickness of the second hydrogen atom distribution region.

2. The active device substrate according to claim 1, wherein the concentration of the hydrogen atoms in the first hydrogen atom distribution region increases first and then decreases in a direction toward the substrate.

3. The active device substrate according to claim 1, wherein the concentration of the nitrogen atoms in the first hydrogen atom distribution region gradually decreases in a direction toward the substrate.

4. The active device substrate according to claim 1, wherein a material of the first gate comprises aluminum, aluminum alloy, molybdenum aluminum alloy, titanium aluminum alloy, molybdenum titanium aluminum alloy, or stacked layers comprising an aluminum layer, and a material of the semiconductor layer comprises metal oxide.

5. The active device substrate according to claim 1, wherein the first gate is located between the first hydrogen atom distribution region and the semiconductor layer.

6. The active device substrate according to claim 4, wherein the active device further comprises:

a second gate overlapping with the semiconductor layer, and the second gate is located between the substrate and the semiconductor layer.

7. The active device substrate according to claim 1, further comprises:
a planarization layer, located on the barrier layer, wherein the planarization layer contacts and covers the second hydrogen atom distribution region.

8. The active device substrate according to claim 1, wherein the thickness of the second hydrogen atom distribution region is 10 nanometers to 600 nanometers, and the thickness of the first hydrogen atom distribution region is 10 nanometers to 600 nanometers.

9. The active device substrate according to claim 1, wherein the second hydrogen atom distribution region is denser than the first hydrogen atom distribution region.

10. The active device substrate according to claim 1, wherein the second hydrogen atom distribution region is directly in contact with the first hydrogen atom distribution region.

11. A manufacturing method of an active device substrate, comprising:
providing a substrate;
forming a semiconductor layer on the substrate;
forming a gate insulation layer on the semiconductor layer;
forming a first gate on the gate insulation layer, wherein the first gate is overlapping with the semiconductor layer;
forming a barrier layer on the first gate and the gate insulation layer by a thin film deposition process, wherein the barrier layer comprises:
a first hydrogen atom distribution region, located on the semiconductor layer, wherein the first hydrogen atom distribution region comprises silicon nitride and hydrogen atoms, wherein the first hydrogen atom distribution region contacts and covers a portion of a top surface of the gate insulation layer, wherein the first hydrogen atom distribution region contacts and covers a top surface and a side surface of the first gate; and
a second hydrogen atom distribution region, wherein the first hydrogen atom distribution region is located between the second hydrogen atom distribution region and the semiconductor layer, wherein the second hydrogen atom distribution region comprises silicon nitride and hydrogen atoms, wherein the concentration of nitrogen atoms in the first hydrogen atom distribution region is smaller than the concentration of nitrogen atoms in the second hydrogen atom distribution region, the highest concentration of the hydrogen atoms in the first hydrogen atom distribution region is greater than the highest concentration of the hydrogen atoms in the second hydrogen atom distribution region, wherein the thickness of the first hydrogen atom distribution region is less than or equal to the thickness of the second hydrogen atom distribution region; and
forming a source and a drain, wherein the source and the drain are electrically connected to the semiconductor layer.

12. The manufacturing method of the active device substrate according to claim 11, wherein the thin film deposition process comprises a plasma enhanced chemical vapor deposition, and a power used for the deposition of the second hydrogen atom distribution region is greater than a power used for the deposition of the first hydrogen atom distribution region.

* * * * *